United States Patent [19]

Thompson et al.

[11] Patent Number: 5,103,280
[45] Date of Patent: Apr. 7, 1992

[54] DUAL ACTIVE LAYER PHOTOCONDUCTOR

[75] Inventors: Phillip E. Thompson, Springfield, Va.; Nicolas A. Papanicolaou, Silver Spring, Md.; J. Bradley Boos, Springfield, Va.

[73] Assignee: The United States of America as represented by the Secretary of the Navy, Washington, D.C.

[21] Appl. No.: 212,841

[22] Filed: Jun. 29, 1988

[51] Int. Cl.$^5$ ............... H01L 27/14; H01L 31/00; H01L 29/76
[52] U.S. Cl. ................................. 357/30; 357/22; 357/23.12; 250/211 J
[58] Field of Search .............. 357/30, 22, 23.12; 250/211 J

[56] References Cited

U.S. PATENT DOCUMENTS

| | | | |
|---|---|---|---|
| 4,169,740 | 10/1979 | Kalbitzer et al. | 357/91 X |
| 4,224,084 | 9/1980 | Pankove | 357/91 X |
| 4,360,246 | 11/1982 | Figueroa et al. | 357/30 |
| 4,383,869 | 5/1983 | Liu | 357/61 X |
| 4,544,939 | 10/1985 | Kosonocky et al. | 357/30 |
| 4,616,246 | 10/1986 | Delahoy | 357/30 |
| 4,663,643 | 5/1987 | Mimura | 357/16 |
| 4,740,823 | 4/1988 | Thompson | 357/30 |

FOREIGN PATENT DOCUMENTS 2166286 4/1986 United Kingdom ............... 357/30

OTHER PUBLICATIONS

N. A. Papanicolaou et al., "Fabrication of a Monolithic GaAs Multi-Channel Detector Amplifier Array," (a paper presented in Oct. 1988).

G. W. Anderson et al., "Planar GaAs Detector-Amplifier Circuits", SPIE vol. 789, Optical Technology for Microwave Application III (1987).

H. Beneking, "Gain and Bandwidth of Fast Near-Infrared Photodetectors: A Comparison of Diodes, Phototransistors, and Photoconductive Devices", IEEE Transactions on Electron Devices, vol. ED-29, No. 9 (Sep. 1982).

J. C. Gammel et al., "An Integrated Photoconductor Detector and Waveguide Structure", Applied Physics Letters, vol. 36, No. 2, (Jan 15, 1980).

M. Rao et al., "Two-Step Rapid Thermal Annealing of Si-Implanted InP:Fe", Applied Physics Letters (May 1987).

Primary Examiner—Jerome Jackson, Jr.
Attorney, Agent, or Firm—Thomas E. McDonnell; Edward F. Miles

[57] ABSTRACT

A photoconductive semiconductor device having a source, a drain, and a photosensitive channel therebetween. The channel has a surface layer that is highly doped with respect to the remainder of the channel, compensating at least in part for the channel's surface depletion layer. In this manner, the photosensitivity of the device is increased without disproportionately increasing wasted dark current. In a preferred embodiment, the additional doping of the channel's surface layer is done by ion implantation, and the device is a monolith formed of gallium arsenide.

13 Claims, 1 Drawing Sheet

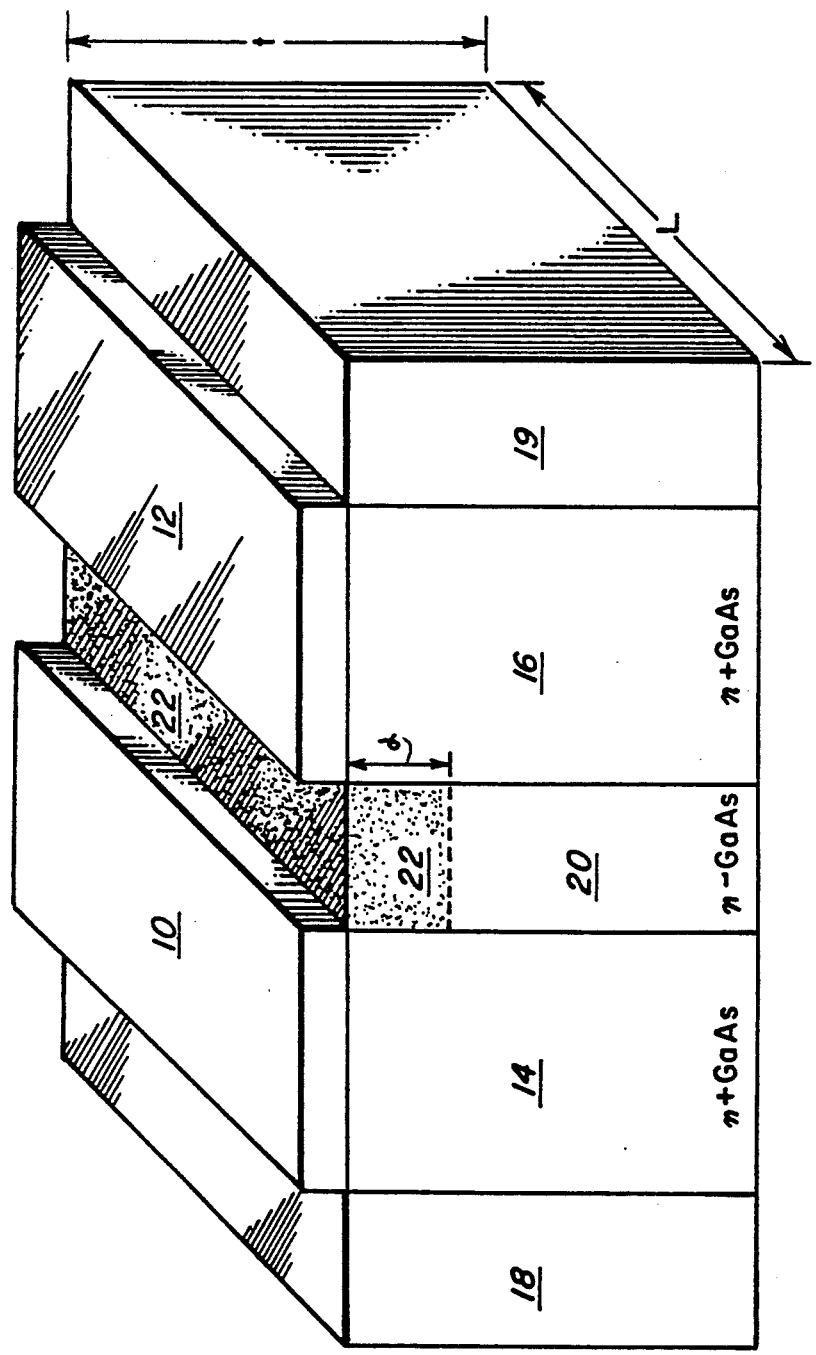

DUAL ACTIVE LAYER PHOTOCONDUCTOR

BACKGROUND

The invention pertains to photoconductive semiconductor devices, more particularly to those that are compatible with monolithic semiconductor fabrication technology, and most particularly to those compatible with gallium arsenide technology.

Photoconductive semiconductor devices have widespread application in electronics. With the growing importance of gallium arsenide technology, most especially for high frequency applications, there is an ever growing need for effective photoconductive devices that are compatible with techniques for fabricating monolithic semiconductor devices in general, and gallium arsenide monolithic devices in particular. A general semiconductor photoconductor can be in a form analogous to a field effect transistor, i.e. having a source and a drain d.c. biased with respect to one another, and separated by a current carrying channel. Light incident on the channel creates electron-hole pairs which alter the channel's resistance, and hence the current flowing in the channel under the d.c. bias. This channel current can be thought of as having two components: signal current ($I_s$) resulting from the interaction of photons with the semiconductor channel as discussed above, and dark current ($I_d$) which exists independent of photo illumination, and is a quiescent current. The respective magnitudes of dark and signal current are given by the following relations:

$$I_d = nv_{sat}L(t-W_D)$$

$$I_s = (qP\lambda G\eta)/hc$$

where n is the doped carrier concentration in the channel, $v_{sat}$ is the saturation velocity of carriers in the channel, L is the channel width, t is the channel thickness, $W_D$ is the surface carrier depletion in the channel, q is the magnitude of carrier charge, P is optical power incident on the channel, $\lambda$ is the wavelength of light incident on the channel, G is the photoconductor's gain, h is Planck's constant, c is the speed of light, and $\eta$ is the quantum efficiency of the semiconductor channel, a measure of the number of free carriers contributing to signal current $I_d$ generated per incident photon.

As can be seen from the first equation, $I_d$ is proportional to doping concentration n. Since the quantum efficiency $\eta$ is dependent upon the thickness of the sensing layer (t - $W_D$), Is is proportional to the thickness of the layer. However, in gallium arsenide the depth of depletion $W_D$ and doping level are not independent because the surface of gallium arsenide has an inherent potential (about 0.7 volts) which creates the depletion layer $W_D$ by driving carriers away from the surface into the bulk crystal. For many doping levels of interest, the depth $W_D$ of the depletion layer is of the same order as the depth of photon penetration, thus rendering such devices virtually useless, or, at best, highly insensitive (low signal current $I_s$ per incident photon). Increasing doping n decreases $W_D$ (hence increases signal current $I_s$) by providing additional charge to counterbalance the surface potential. Unfortunately, this also drastically increases dark current $I_d$. Because dark current $I_d$ depends strongly on doping in the bulk channel volume, increasing signal current $I_s$ in this manner disproportionately increases dark current $I_d$. Thus, the apparent inability to increase signal current $I_s$ independent of dark current $I_d$ makes photoconductive devices of this kind apparently impossible to optimize.

SUMMARY

Accordingly, an object of the invention is to increase the sensitivity of semiconductor photoconductive devices of the kind described above, i.e, increase the ratio of signal current per unit of light incident on the photoconductor.

Another object of the invention is to enable one to optimize the ratio of signal to dark current in such devices.

Another object of the invention is to do the foregoing by compensating for residual semiconductor surface potential.

Another object of the invention is to increase the photosensitivity of such devices by decreasing the depth of the surface depletion layer.

Another object of the invention is to do the foregoing by techniques that make the doping profiles easily reproducible, and hence aid the economical manufacture of these devices.

Another object of the invention is to make the production of such devices compatible with current techniques for monolithic semiconductor production, most especially that of gallium arsenide.

In accordance with these and other objects made apparent hereinafter, the invention is a semiconductor photoconductor device having a source, a drain, and a channel therebetween, with the addition of a thin surface layer on the channel which is highly doped with respect to the remainder of the channel. The high doping in the surface layer provides additional charge which compensates for the residual surface potential, in effect establishing a charge balance at the channel's surface which shields the channel's interior. In this manner the effects of the residual surface potential are mitigated, thus reducing the depletion layer with a corresponding increase in the channel's photosensitive depth and increase in device photosensitivity. Because this increased sensitivity requires only small, localized, additional doping, the concomitant increase in dark current is far smaller than for a corresponding increase in signal current generated by whole channel doping, thus providing a basis for designing optimal photoconductive devices of this kind.

The invention is more fully appreciated from the following detailed description of a preferred embodiment, it being understood, however, that the invention is capable of extended application beyond the precise details of the preferred embodiment. Changes and modifications can be made that do not affect the spirit of the invention, nor exceed its scope, as expressed in the appended claims. Accordingly, the invention is described with particular reference to the accompanying drawing figure, wherein:

BRIEF DESCRIPTION OF THE DRAWING FIGURE

The drawing figure is an elevational, isometric, view of an embodiment of the invention (not to scale).

DETAILED DESCRIPTION

With reference to the drawing figure, an embodiment of the invention is shown in the form of a semiconductor monolith of gallium arsenide having source 14, drain 16, and channel 20 between source 14 and drain 16.

Channel 20 has a face portion 22 for receiving incident light. The device's channel length L and channel thickness t are indicated on the drawing figure. Source 14 and drain 16 have respective metallizations 10,12 for connecting the device to external circuitry. The device can have isolating layers 18,19, which can be formed by ion implantation damage, or any other conventional technique. The device itself can be an epitaxial growth on a semiinsulating substrate (not shown), such as of gallium arsenide, for integrally fabricating the device in a larger monolith. In this embodiment, the bulk semiconductor in channel 20 is n doped, and source and drain portions 14, 16 n+ doped with respect to the bulk doping in channel portion 20.

Channel 20 has a surface layer 22 of thickness $a$ which is highly doped with respect to the remainder of channel 20. The doping of channel 20 should be as low as possible to minimize dark current (but, of course, still have sufficient doping to ensure that the semiconductor of channel 20 will not act as an insulator). Presently, molecular beam epitaxy can produce active, n doped, gallium arsenide at a concentration as low as $5(10)^{14} cm^{-3}$, and this is the preferred dopant level. (Higher doping levels in channel 20 will work, but will increase dark current.) The doping in the surface layer 22 is of a preselected amount additional to the preselected doping in the semiconductor constituting channel 20 and is advantageously done by the well understood and well controlled technique of ion implantation. The thickness and carrier concentration of surface layer 22 are determined so that the surface depletion depth is slightly greater than the surface layer thickness $a$. This is so that surface layer 22 remains relatively isolated electrically from the remainder of channel 20 so as to minimize layer 22's contribution to dark current. For given values of doping, one skilled in the art can calculate the surface depletion depth, and hence the desired thickness of the surface layer $a$, from known principles, i.e.:

$$a = \sqrt{\frac{2k_s \epsilon_o V_{bi}}{qN}}$$

where $k_s$ is the dielectric constant of the material constituting channel 20, $\epsilon$ is the permittivity of free space, $V_{bi}$ is the built in potential at the surface, q is the charge of an electron, and N is the carrier concentration at the surface of channel 20. The carrier concentration and the thickness of layer 22 are independent of the carrier concentration of the remainder of channel 20, and of the geometry of the device.

For ion implantation, the depth of penetration profile is roughly gaussian distributed, and the magnitude of difference between the depletion depth ($W_D$) and the depth of layer 22 ($a$) should be chosen to prevent stray dopant atoms in the "tail" of this gaussian error distribution from overcoming the electrical separation the remainder of channel 20 from layer 22. Skilled workers in the art of semiconductor fabrication are competent to choose the specific magnitudes of these layers, and indeed such workers make these kind of judgments on a daily basis. For a doping level in layer 22 of $10^{17} cm^{-3}$, layer 22 is roughly $10^3$ Å (i.e. about 0.1 micrometer). For gallium arsenide devices, only n type doping is of interest because a p type device would be slow (have low carrier mobility), defeating an inherent advantage of gallium arsenide. Any conventional n type dopant that is compatible with gallium arsenide can by used advantageously, although for layer 22 silicon is preferred because of the great experience industry has with silicon as a dopant.

Because the preferred embodiment has the source, drain, and channel fabricated integrally in a gallium arsenide wafer differing only in doping levels, the device is compatible with standard semiconductor fabrication technology, and particularly that of gallium arsenide. The additional surface doping on the channel is preferably done by ion implantation, a technique which is well understood and normally part of gallium arsenide fabrication processes, and one would require no extra steps in these processes. Moreover, ion implantation allows for highly reproducible doping profiles in the surface layer, further easing fabrication.

A test was run with a photoconductor of the kind illustrated in the drawing figure. The channel doping was $5(10)^{14} cm^{-3}$. Without the conductive surface layer, the dark current at 5 V between the source and drain was 180 nA. When a conductive surface layer was produced using the implantation of silicon at energies of 50 keV and 100 keV and fluences of $7(10)^{11} cm^{-2}$ and $1.2(10)^{12} cm^{-2}$, respectively, the dark current at 5 V increased to 12.4 mA. However, this dark current is substantially less than what would have been seen if the entire photoconductive channel had the higher doping. Both types of photoconductors, i.e. with and without the conductive surface layer, were tested with pulsed excitation. Pulse duration was $1(10)^{-12}$s. The pulse power was $100(10)^{-6}$ watt. The repetition rate was 82 megahertz. The photoconductors without a conductive surface layer had a current peak of 0.70 mA and a response time of 0.4 ns. The gain, or number of electrons per incident photon, was 0.2. The implanted photoconductors had a current peak of 2.1 mA, a pulse duration of 6.8 ns, and a gain of 9. Additionally, it was noted that after ion bombardment the performance values of dark current and signal current was more uniform from device to device.

The invention has been shown in what is considered to be the most practical and preferred embodiment. It is recognized, however, that obvious modification may occur to those with skill in this art. By way of example, although the preferred embodiment employs a gallium arsenide channel, this is done because of the great interest in gallium arsenide technology. The teachings of the invention, however, pertain to any semiconductor material useable in photoconductive devices that has a surface depletion layer resulting from surface potential. Similarly, although the preferred embodiment employs ion implantation to provide the additional doping to the channel's surface layer, any of a number of well understood techniques could also be employed, for example, molecular beam epitaxy, metal-organic vapor deposition, liquid phase epitaxy, or vapor phase epitaxy. Accordingly, the scope of the invention is to be discerned solely by reference to the appended claims, wherein:

What is claimed and desired to be secured by Letters Patent of the United States is:

1. A photoconductor comprising:
   a source;
   a drain; and
   a channel, said channel having a surface means for receiving incident light, said channel being formed of semiconductor material having a surface depletion layer extending from said surface means into said channel;

wherein said channel comprises a means for causing an increase in the photosensitivity of said photoconductor over the photosensitivity of said photoconductor absent said means, said means for causing said increase in said photosensitivity comprising a surface portion of said channel, said surface portion of said channel extending from said surface means into said channel, said surface portion of said channel being highly doped with respect to the remainder of said channel in an amount effective to cause said increase in said photosensitivity by reducing the depth that said surface depletion layer extends from said surface means into said channel; and wherein said surface portion, absent said doping, and the remainder of said channel, each consists essentially of the same semiconductor material.

2. The device of claim 1, wherein said semiconductor material is gallium arsenide.

3. The device of claim 2 wherein said surface portion is a surface layer said surface portion of said channel has n doping to a carrier concentration of greater than or equal to about $10^{17} cm^{-3}$, the remainder of said channel has n doping to a carrier concentration greater than or equal to about $5(10)^{14} cm^{-3}$, and said surface layer extends in said semiconductor material to a depth less than or equal to about 0.1 micrometer from said face.

4. The device of claim 3, wherein said source and said drain are monolithic with said semiconductor material, said source and said drain each being of gallium arsenide n+ doped with respect to said n doping of said remainder of said channel.

5. The device of claim 1 wherein said doping of said surface portion of said channel is produced by the process of ion implantation.

6. The device of claim 5, wherein the ions used in said ion implantation are silicon.

7. The device of claim 6, wherein said ions bombard said surface portion with a kinetic energy of between about 50 and 100 keV.

8. The device of claim 7, wherein said semiconductor material is gallium arsenide.

9. The device of claim 8, wherein said surface portion extends into said semiconductor material to a depth of less than or equal to about 0.1 micrometer from said surface means, and the remainder of said channel has n doping to a carrier concentration of greater than or equal to about $5(10)^{14} cm^{-3}$.

10. The device of claim 9, wherein said source and said drain are monolithic with said semiconductor, said source and said drain each being of gallium arsenide n+ doped with respect to said doping of said remainder of said channel.

11. The device of claim 1, wherein said semiconductor material is of gallium arsenide, and the dopant in said surface portion is silicon.

12. A photoconductor comprising:
a source;
a drain; and
a channel, said channel having a surface means for receiving incident light, said channel being formed of semiconductor material having a surface depletion layer extending from said surface means into said channel;
wherein said channel comprises a means for causing an increase in the photosensitivity of said photoconductor over the photosensitivity of said photoconductor absent said means, said means for causing said increase in said photosensitivity comprising a surface portion of said channel, said surface portion of said channel extending from said surface means into said channel, said surface portion of said channel being highly doped with respect to the remainder of said channel in an amount effective to cause said increase in said photosensitivity by reducing the depth that said surface depletion layer extends from said surface means into said channel;
wherein said semiconductor material is of gallium arsenide, and the dopant in said surface portion is silicon; and wherein:
said surface portion of said channel is doped to a carrier concentration of greater than or equal to about $10^{17} cm^{-3}$;
the remainder of said channel is doped to a carrier concentration of greater than or equal to about $5(10)^{14} cm^{-3}$; and
said surface portion extends into said semiconductor material to a depth less than or equal to about 0.1 micrometer from the face.

13. A photoconductor comprising:
a source;
a drain; and
a channel, said channel having a surface for receiving incident light, said channel being formed of semiconductor material having a surface depletion layer extending from said surface into said channel;
wherein said channel comprises a surface portion, said surface portion of said channel extending from said surface into said channel and being highly doped with respect to the remainder of said channel in an amount effective to cause an increase in said the photosensitivity of said photoconductor by reducing the depth that said surface depletion layer extends from said surface into said channel; and
wherein said surface portion, absent said doping, and the remainder of said channel, each consists essentially of the same semiconductor material.

* * * * *